United States Patent [19]
Kurosawa

[11] Patent Number: 6,107,600
[45] Date of Patent: Aug. 22, 2000

[54] LASER MACHINING APPARATUS

[75] Inventor: Miki Kurosawa, Nagoya, Japan

[73] Assignee: Mitsubishi Denki Kabushiki Kaisha, Tokyo, Japan

[21] Appl. No.: 09/106,767

[22] Filed: Jun. 30, 1998

[30] Foreign Application Priority Data

Feb. 27, 1998 [JP] Japan .................................. 10-047167

[51] Int. Cl.[7] .................................................. B23K 26/00
[52] U.S. Cl. .................................... 219/121.8; 219/121.7; 219/121.74; 359/198; 359/202
[58] Field of Search .......................... 219/121.74, 121.8, 219/121.7, 121.71; 359/198, 199, 200, 201, 202, 203; 427/523

[56] References Cited

U.S. PATENT DOCUMENTS

| | | |
|---|---|---|
| 4,368,489 | 1/1983 | Stemme et al. . |
| 4,532,402 | 7/1985 | Overbeck ............................ 219/121.74 |
| 5,037,183 | 8/1991 | Gagosz et al. ....................... 219/121.7 |
| 5,105,297 | 4/1992 | Kessler ..................................... 359/198 |
| 5,185,676 | 2/1993 | Nishiberi . |
| 5,408,253 | 4/1995 | Iddan . |
| 5,547,714 | 8/1996 | Huck et al. ............................. 427/523 |
| 5,606,447 | 2/1997 | Asada et al. ............................ 359/198 |
| 5,646,765 | 7/1997 | Laakmann et al. . |

FOREIGN PATENT DOCUMENTS

| | | |
|---|---|---|
| 57-191615 | 11/1982 | Japan . |
| 1-102424 | 4/1989 | Japan . |
| 1-113930 | 5/1989 | Japan . |
| 2-301024 | 12/1990 | Japan . |
| 4-70712 | 3/1992 | Japan . |

*Primary Examiner*—Geoffrey S. Evans
*Attorney, Agent, or Firm*—Sughrue, Mion, Zinn, Macpeak & Seas, PLLC

[57] ABSTRACT

A laser machining apparatus comprises a laser oscillator for emitting a laser beam, a deflecting mirror for reflecting the laser beam emitted from the laser oscillator, a galvanometer scanner for swinging the deflecting mirror, and a mounting/holding mechanism for a galvanometer scanner capable of adjusting a mounting angular position of the galvanometer scanner around a shaft of the deflecting mirror.

18 Claims, 8 Drawing Sheets

TRIGGER SIGNAL
FOR EMISSION OF
LASER BEAM

INPUT SIGNAL
(POSITIONAL SIGNAL)

DISPLACEMENT
ERROR SIGNAL

STABILIZED AREA

LASER MACHINING APPARATUS

FIELD OF THE INVENTION

The present invention relates to a laser machining apparatus and more particularly, to a laser machining apparatus for a process of boring a printed circuit board or the like for rapidly machining holes by instantly positioning a laser beam at a particular point on the printed circuit board as a work and irradiating the pulse-formed laser beam emitted from a laser oscillator onto the point by being reflected on a deflecting mirror swung by a galvanometer scanner.

BACKGROUND OF THE INVENTION

In recent years, a machining method using a laser beam has been applied, in processes of manufacturing products and components or the like, for applications difficult with the conventional machining method. Especially in a manufacturing process of printed circuit boards, the tendency for minimization and higher integration degree of a circuit for electronic equipment has been becoming increasingly visible, and it is required also in a boring process executed in a process of manufacturing printed circuit boards to bore fine holes which are so fine that the conventional drilling technology can not be applied to. As an alternative for the boring process with a drill, a boring process with a laser is applied for boring a printed circuit board.

When boring a printed circuit board with a laser, a pulse-formed laser beam emitted from a laser oscillator is converged onto a particular point on the printed circuit board, and a substrate material made of epoxy resin or the like on the irradiated portion is removed by means of thermal decomposition. It is generally required to machine thousands to tens of thousands of holes per substrate for a comparatively high-density printed circuit board which requires machining of fine holes with a laser beam as described above, and in order to bore such a large number of holes within a short period of time, a position to which a laser beam is to be irradiated should rapidly be moved, and a galvanometer scanner is used for that purpose as a high-speed positioning unit for a laser beam.

For example, FIG. 4 is a view for explaining general configuration of a laser machining apparatus 50 for a process of boring a printed circuit board based on the conventional technology using a galvanometer scanner. One of laser machining apparatuses based on the conventional technology using a galvanometer scanner is disclosed in Japanese Patent Laid-Open Publication No. HEI 5-2146, and especially as a laser machining apparatus for a process of boring a printed circuit board, there is the one disclosed in Japanese Patent Laid-Open Publication No. HEI 7-32183.

Description is made hereinafter for operations of the laser machining apparatus 50 for a process of boring a printed circuit board based on the conventional technology with reference to FIG. 4. At first, a pulse-formed laser beam LB emitted from a laser oscillator 52 is reflected by a pair of rectangular deflecting mirrors 54, 56 each with abase material of the mirror made of fused quartz, the reflected laser beam LB is converged through a fθlens 64 and irradiated onto a printed circuit board 66. Each of the deflecting mirrors 54, 56 is fixed to each end of shafts 68 for a pair of galvanometer scanners 58, 60 each fixed to a scanner holding section 62 respectively.

The galvanometer scanners 58, 60 are connected to a scanner driving amplifier 85. This scanner driving amplifier 85 rotates, by sending to the galvanometer scanners 58, 60 a current instruction corresponding to a positional instruction issued from an instructing section 88 in synchronism with each pulse of a laser beam, each of the shafts 68 by an angle corresponding to the positional instruction, swings the deflecting mirrors 54, 56, and positions the laser beam LB for each pulse at a particular position on the printed circuit board 66, so that a boring process is executed.

In this process, since an area on the printed circuit board 66 onto which a laser beam can be irradiated through the fθlens 64 is only a finite scanned area 67, the printed circuit board 66 is successively moved within a plane vertical to the laser beam with an XY table 69 driven by an NC unit 89 each time when machining for one scanned area 67 is finished so that all the scanned areas 67 on the board can be machined.

Next description is made for the structure and operational principles of the galvanometer scanners 58 and 60. The galvanometer scanner is an electric motor of which shaft can rotate only in a finite angular range, and is also a drive unit for swinging a deflecting mirror to deflect a laser beam which is generally used in any optical device using a laser beam.

FIG. 5 shows a block diagram of the galvanometer scanner 58 as well as of a control circuit for the scanner. The galvanometer scanner 60 has the configuration as shown in FIG. 5, although not shown in the figure. In FIG. 5, the galvanometer scanner 58 comprises a shaft 68 for swinging the deflecting mirror 54, a permanent magnet 70, a drive coil 76, and a static capacitance type of angle detector 80 fixed to the shaft 68 for detecting angular displacement of the shaft 68.

A biased magnetic field 74 generated by the permanent magnet 70 and a driving magnetic field 78 generated by passing a current through the drive coil 76 are indicated by arrows in the figure, and rotating torque to the shaft 68 is generated by interaction between the biased magnetic field 74 and the driven magnetic field 78.

The scanner driving amplifier 85 as a control circuit for the galvanometer scanner 58 can provide controls so as to rotate the shaft 68 in a specified direction by a specified angle by amplifying a displacement error signal as a difference between an angular displacement signal outputted from the static capacitance type angle detector 80 and a positional instruction as an input signal by a current amplifier 84 and changing the amplified signal to a driving current for being passed to the drive coil 76. Namely, servo control is executed by feeding back a displacement signal outputted from the static capacitance type angle detector 80 to an input signal and constituting a closed loop.

The galvanometer scanner 58 has the configuration as described above, the deflecting mirror 54 is fixed to the end of the shaft 68, and the pair of galvanometer scanners 58, 60 are placed as shown in FIG. 4, so that a laser beam can be irradiated onto a specified position on the printed circuit board 66 according to a positional instruction from the instructing section 88.

FIG. 7 shows a perspective appearance view of the galvanometer scanner 58. The galvanometer scanner 58 has a cubic form here, and screw holes 86 for fixing the main body of the galvanometer scanner 58 are provided on one face of the cube. In the laser machining apparatus for a process of boring a printed circuit board based on the conventional technology using the galvanometer scanner 58, the galvanometer scanner 58 is fixed to the scanner holding section 62 through the screw holes 86 provided on the side face of the main body of the galvanometer scanner without giving any rotational flexibility to the shaft 68 to the main body of the galvanometer scanner as shown in FIG. 4.

The deflecting mirror 54 used in the laser machining apparatus for a process of boring a printed circuit board based on the conventional technology using the galvanometer scanner employs a mirror substrate made of fused quartz having comparatively low solidity, and is a rectangle as shown in FIG. 8.

However, with the laser machining apparatus for a process of boring a printed circuit board using the galvanometer scanner based on the conventional technology as described above, when a deflecting mirror is fast swung for positioning a laser beam within a short period of time, uncontrollable vibrations occur on the shaft 68 due to unbalance between rotational centers which the shaft 68 of the galvanometer scanner 58 and the deflecting mirror 54 have respectively, and deflection occurs in the deflecting mirror 54 fixed to the end of the shaft 68, so that a laser beam can not accurately be positioned to a specified position on the printed circuit board, which causes positional accuracy of machined holes to be reduced.

Especially, reduction of the positional accuracy is significant when extremely high-speed positioning is performed for 500 points or more per sec, which becomes a great obstacle in machining a high integration degree printed circuit board requiring a large number of holes to be machined with high accuracy within a short period of time.

Description is made herein for the unbalance between a rotational center of the shaft 68 of the galvanometer scanner 58 and that of the deflecting mirror 54 which causes the reduction of positional accuracy. The shaft 68 of the galvanometer scanner 58 and the deflecting mirror 54 fixed to the end of the shaft 68 have eccentricities $\epsilon_1$, $\epsilon_2$ each against the rotational center respectively.

Those eccentricities $\epsilon_1$, $\epsilon_2$ are generated by an error in manufacturing the galvanometer scanner 58 and the deflecting mirror 54, and it is difficult to manufacture the shaft 68 and the deflecting mirror 54 each with complete symmetry with respect to rotation for the purpose to eliminate the eccentricity. The unbalance is expressed by a product of mass and eccentricity, and unbalance U1 of the deflecting mirror 54 is expressed as follows:

$$U1 = m1 \epsilon_1$$

On the other hand, unbalance U2 of the shaft 68 is expressed as follows:

$$U2 = m2 \epsilon_2$$

wherein, m1 indicates mass of the deflecting mirror 54, and m2 indicates mass of the shaft 68.

By the way, unbalance U synthesized when the deflecting mirror 54 is fixed to the end of the shaft 68 so that both of the components are made to one-piece is expressed as follows:

$$U = U1 + U2$$

As shown in FIGS. 9A and 9B, when an angle $\theta$ of U2 to U1 is used, the expression is changed as follows:

$$U = U1 + U2 \cos\theta$$

Herein, as shown in FIG. 9A and FIG. 9B, the following conditions are satisfied:

when $\theta < 90$ degrees and 270 degrees $< \theta$, $U2 \cos\theta > 0$ when 90 degrees $< \theta < 270$ degrees, $U2 \cos\theta < 0$ and the synthesized unbalance U changes in degrees according to a positional relation between the eccentricities against the rotational center, namely, according to a mounting angular position of the deflecting mirror 54 to the shaft 68, so that, when the degree is set to 180 degrees: $\theta = 180$ degrees, the synthesized unbalance can be made to a minimum value.

In a rotating body, if a rotational speed of a shaft is higher, an allowable value to the unbalance which causes vibrations is generally smaller. The above fact is also effected in a case where a galvanometer scanner is used, and it is required to make smaller the unbalance synthesized when the shaft 68 and the deflecting mirror 54 are made to one-piece for the purpose of rapidly rotating the shaft 68 so that a laser beam can more rapidly be positioned.

Description is made hereinafter for a difference between operations of the galvanometer scanner according to difference in degrees of unbalance. FIGS. 6A to 6C are time charts showing synchronism between irradiation of a laser beam and operations of the galvanometer scanner in a laser machining apparatus for a process of boring a printed circuit board using a galvanometer scanner.

In the chart, FIG. 6A shows a trigger signal for emission of a laser beam, FIG. 6B shows an input signal indicating a positional instruction to a galvanometer scanner, and FIG. 6C shows a displacement error signal indicating a difference between a positional instruction and displacement generated by rotating a deflecting mirror according to the instruction. A shaft of the galvanometer scanner is rotated in an area where a positional instruction is being changed, and displacement of the shaft is gradually converged toward the targeted position in a stabilized area where the positional instruction is constant, so that a displacement error signal is reduced to zero. At this point of time when this displacement error signal is zero, a laser beam is emitted in pulses according to a trigger signal for laser emission, and by irradiating the laser beam onto a printed circuit board, a hole is made at an accurate position.

When a mounting angular position of the deflecting mirror 54 to the shaft 68 is appropriate and unbalance is suppressed to a minimum, the displacement error signal is smoothly converging to zero as indicated by a solid line in the stabilized area, and in contrast to the above case, when the mounting angular position of the deflecting mirror 54 to the shaft 68 is inappropriate and large unbalance occurs, the displacement error signal is vibrated due to vibrations of the shaft 68 as indicated by a broken line, and operational performance of the galvanometer scanner are resultantly reduced, so that there occurs displacement between a position to which a laser beam is irradiated and an accurate position on the printed circuit board because the deflected mirror can not be stopped at the accurate position.

However, in the laser machining apparatus for a process of boring a printed circuit board based on the conventional technology using a galvanometer scanner, as shown in FIG. 4, each of the galvanometer scanners 58, 60 is fixed to the scanner holding section 62 without giving any rotational flexibility to the shaft 68 to the main body of galvanometer scanner.

For this reason, when the positional instruction to the galvanometer scanners 58, 60 is zero, namely when the shaft 68 is positioned at a midpoint of the maximum rotational angle, to position a laser beam at a center of a scanned area 67, each mounting angular position of the deflecting mirrors 54, 56 to each of the shafts 68 of the galvanometer scanners 58, 60 has to be decided unitarily.

As described above, once each mounting angular position of the deflecting mirrors 54, 56 to each of the shafts 68 of the galvanometer scanners 58, 60 is decided unitrarily, each of the deflecting mirrors 54, 56 can not be fixed to a mounting angular position to the shaft 68 where unbalance synthesized between the shaft and the deflecting mirror is minimized as described above, and for this reason it is difficult to suppress the unbalance to the minimum level.

As a result, when a high-speed positioning operation is carried out, the operational performance of the galvanometer scanner are extremely reduced, and the deflecting mirror 54 is deflected due to generation of vibrations when the shaft 68 is stabilized at the moment at which a laser beam is irradiated, so that positioning accuracy for a laser beam is reduced. As described above, when the galvanometer scanners are held, unbalance in the shaft can not be suppressed, so that it is difficult to bore the printed circuit board 66 with high speed and high accuracy.

On the other hand, when a deflecting mirror is rapidly swung for positioning a laser beam with high speed and high accuracy, it is important to make a moment of inertia that the deflecting mirror has as small as possible.

However, when a laser beam LB being circular in cross section is reflected as shown in FIG. 8 on a rectangular deflecting mirror comprising a mirror substrate made of fused quartz crystal based on the conventional technology, there is extra area 55 which is not dedicated to reception of the laser beam LB, so that the moment of inertia is large, and as a result, the deflecting mirror 54 can not be swung at a high speed by the galvanometer scanner.

Especially, the fused quartz crystal used for the conventional type of deflecting mirror has comparatively low solidity, so that the mirror substrate is easily distorted, and it is difficult to manufacture a thin mirror substrate, and as a result the mirror substrate can not be made thinner, which makes it difficult to suppress the moment of inertia to a low level.

SUMMARY OF THE INVENTION

It is an object of the present invention to obtain a high-productivity laser machining apparatus for a process of boring a printed circuit board in which deflection of a deflecting mirror due to vibrations of a shaft generated from unbalance between eccentricity of the shaft of a galvanometer scanner from the rotational center and that of the deflecting mirror generated when the deflecting mirror is rapidly swung is suppressed, a moment of inertia of the deflecting mirror is made as small as possible with the flatness insured, and a laser beam is positioned at a specified position on a printed circuit board with high speed and high accuracy to execute a boring process.

With the laser machining apparatus according to the present invention, there is provided a mounting mechanism for a galvanometer scanner capable of adjusting a mounting angular position of the galvanometer scanner around a shaft of a deflecting mirror, so that reduction of operational performance of the galvanometer scanner generated by a mounting angular position of the deflecting mirror can be suppressed, and the process of boring a printed circuit board can be performed with high speed and high accuracy.

With the laser machining apparatus according to the present invention, a deflecting mirror has a light-receiving area limited to an area which the laser beam moving in association with deflection of the mirror actually enters, so that the deflecting mirror requires only a minimum size with a required form, and a moment of inertia becomes smaller, and for this reason the process of boring a printed circuit board can be performed with high speed and high accuracy.

Other objects and features of this invention will become understood from the following description with reference to the accompanying drawings.

DESCRIPTION OF THE PREFERRED EMBODIMENT

Detailed description is made hereinafter for a preferred embodiment of a laser machining apparatus according to the present invention with reference to the related drawings.

Figure 1:
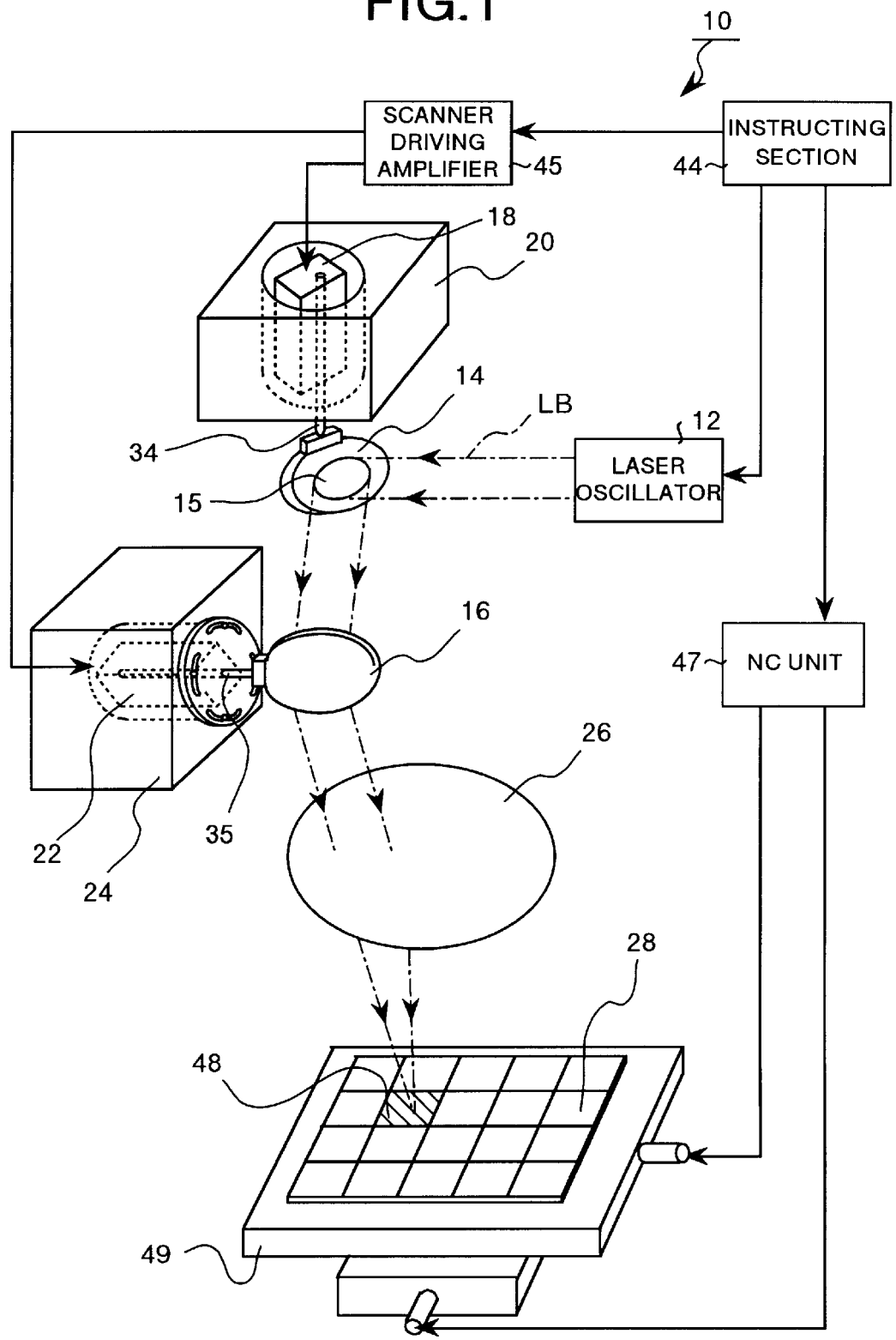
FIG. 1 is a perspective view showing schematic configuration of a laser machining apparatus according to Embodiment of the present invention.

FIG. 1 is a perspective view showing schematic configuration of a laser machining apparatus 10 according to Embodiment of the present invention. This laser machining apparatus 10 comprises, in FIG. 1, a laser oscillator 12, deflecting mirrors 14 and 16 each for reflecting a laser beam LB emitted from the laser oscillator 12, galvanometer scanners 18 and 22 for rapidly swinging those deflecting mirrors 14 and 16 respectively, mounting/holding mechanisms 20 and 24 for holding the galvanometer scanners 18 and 22 each with a rotational freedom, said galvanometer scanner adjusting each mounting angular position of the deflecting mirrors 14 and 16 with rotational flexibility to a rotational center of shafts 34 and 35 of the mirrors respectively, fixing and holding the shafts after the adjustment thereof to each particular angular position is finished so that each main body of the galvanometer scanners has rotational flexibility against the shafts, and a fθ lens 26 for converging the laser beam LB reflected and deflected by the deflecting mirrors 14 and 16 onto the identical surface of the plane.

The laser beam LB converged through this fθ lens 26 is irradiated to a position for machining on a printed circuit board 28 as a work to be machined placed on a XY table 49, so that the boring process is performed.

The laser machining apparatus according to the embodiment has the mounting/holding mechanisms 20 and 24 for holding the galvanometer scanners 18 and 22 so as to have rotational flexibility to the shafts 34 and 35 of the deflecting mirrors 14 and 16 respectively and is characterized in terms of a form and a material of the deflecting mirrors 14 and 16. Description is made hereinafter for the characteristic configuration in this embodiment with reference to FIGS. 2A to 2C and FIGS. 3A and 3B.

It should be noted that the two galvanometer scanners shown in FIG. 1 have substantially the same structure, so that description is made as follows mainly for the galvanometer scanner 18.

Figure 2C:
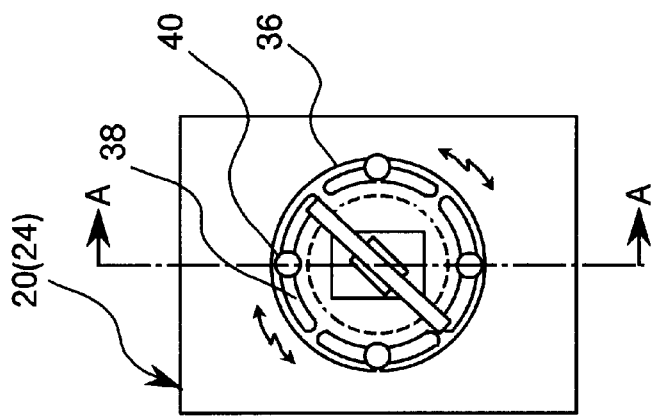
FIGS. 2A to 2C are explanatory views showing a mounting/holding mechanism for holding the galvanometer scanner shown in FIG. 1 with giving thereto rotational flexibility to a center of a shaft.
Figure 2B:
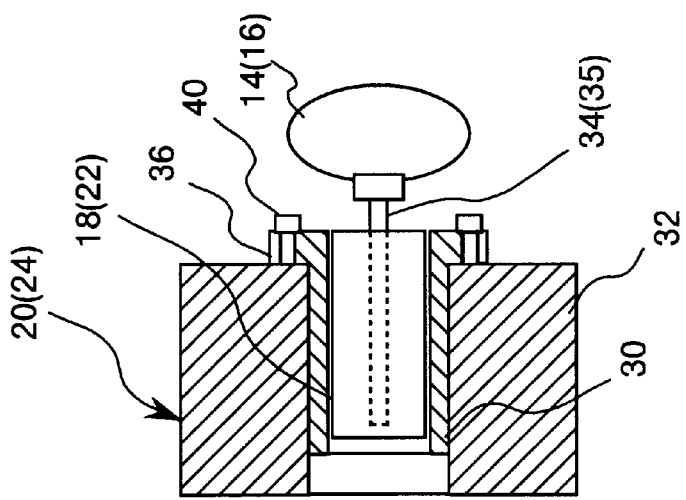
Figure 2A:
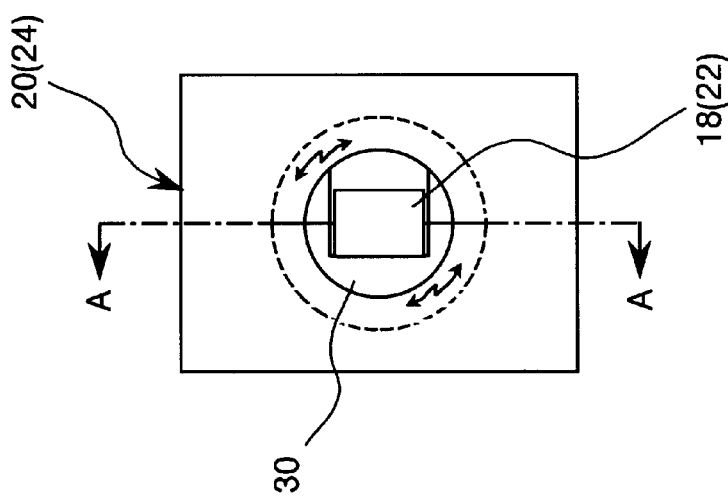

At first, FIGS. 2A to 2C show views of the mounting/holding mechanism 20 for holding the galvanometer scanner 18 in FIG. 1 so as to have rotational flexibility to the center of the shaft, in which FIG. 2A is a left side view of the mechanism, FIG. 2B is a cross-sectional view thereof taken along the line A—A in FIG. 2A or FIG. 2C, and FIG. 2C is a right side view thereof.

In FIGS. 2A to 2C, the mounting/holding mechanism 20 has a rotational cylinder 30 to which the galvanometer scanner 18 is fixed and a rotational cylinder-receiver 32 with the rotational cylinder 30 accommodated therein, and a flange section 36 with a widened edge of the cylinder is provided at one end of the rotational cylinder 30 as shown in FIG. 2B.

The rotational cylinder 30 has, as shown in FIG. 2A, a semi-cylindrical form so as to cover the galvanometer scanner 18, and the galvanometer scanner 18 and the rotational cylinder 30 are integrally fixed with screws not shown in the figure so that a central axis of the cylinder section and the galvanometer scanner 18, namely a center of the shaft 34 of the deflecting mirror 14 are identically fixed to each other.

The rotational cylinder 30 integrated to this galvanometer scanner 18 is inserted into the rotational cylinder-receiver 32 with a cylindrical hole having the same diameter as that of the cylinder section of the rotational cylinder 30 provided therein through the cylinder section, and is fixed to the rotational cylinder-receiver 32 with mounting screws 40 passing through arc-shaped wide holes 38 provided on the flange section 36 of the rotational cylinder 30. If the mounting screws 40 are loosened here, the rotational cylinder 30 can acquire flexibility to the rotational cylinder-receiver 32 in a rotating direction by an arc length of the arc-shaped wide hole 38.

The galvanometer scanner 18 can adjust, because the center of the shaft 34 of the deflecting mirror 14 and the central axis of the rotational cylinder 30 are identical to each other, a mounting angular position of the deflecting mirror 14 with rotational flexibility to the center of the shaft 34 thereof and can fix and hold the shaft after the adjustment of the shaft to a particular angular position is finished.

Next description is made for operations of finding out a mounting angular position where vibrations due to unbalance caused when the deflecting mirror 14 is fixed to the shaft 34 by the mounting/holding mechanism 20 is not generated.

At first, the deflecting mirror 14 is fixed to the shaft 34 of the galvanometer scanner 18 at an arbitrary mounting angular position. Then, the galvanometer scanner 18 is driven at a speed as high as that used in the case where the machining is actually carried out, and how the galvanometer scanner 18 operates at that time is observed according to displacement error signals.

Figure 6A:
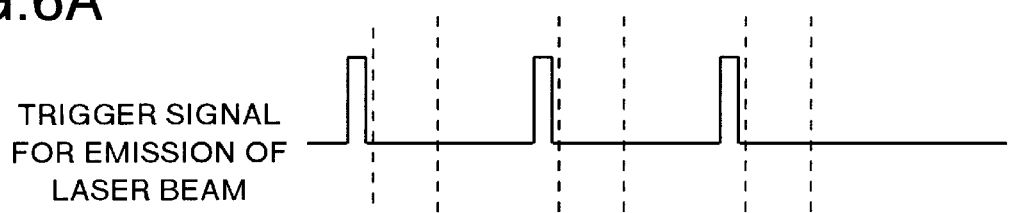
FIGS. 6A to 6C are diagrams showing waveforms of a trigger signal for laser emission, an input signal, and a displacement error signal.
Figure 6B:
Figure 6C:
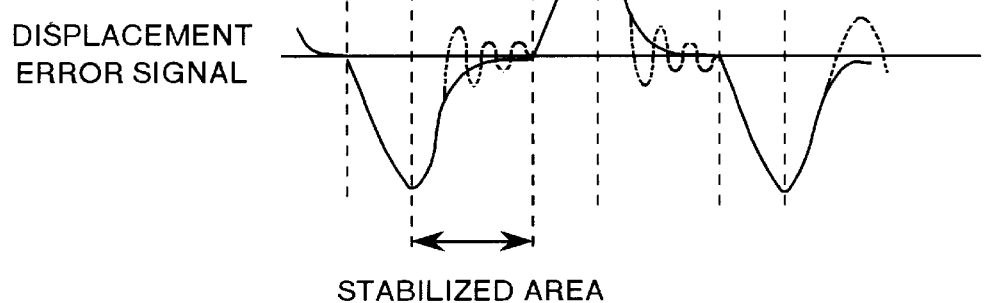
Figure 7:
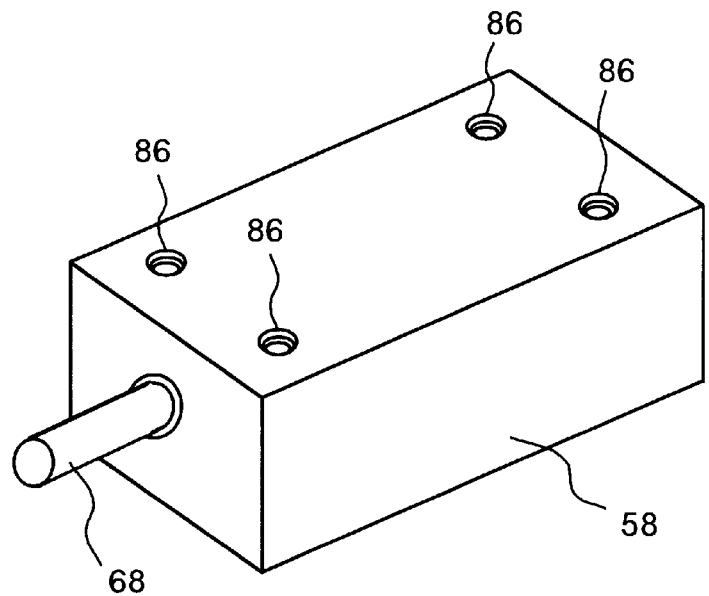
FIG. 7 is a perspective appearance view of the galvanometer scanner.
Figure 8:
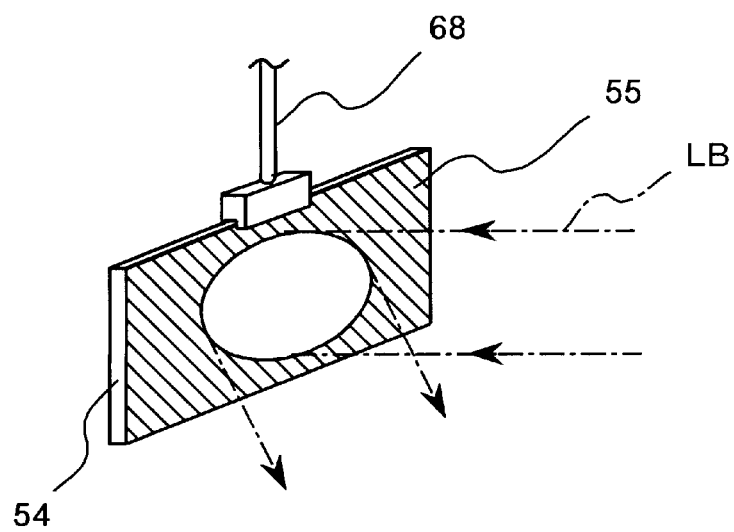
FIG. 8 is a perspective view showing a deflecting mirror based on the conventional technology.
Figure 9A:
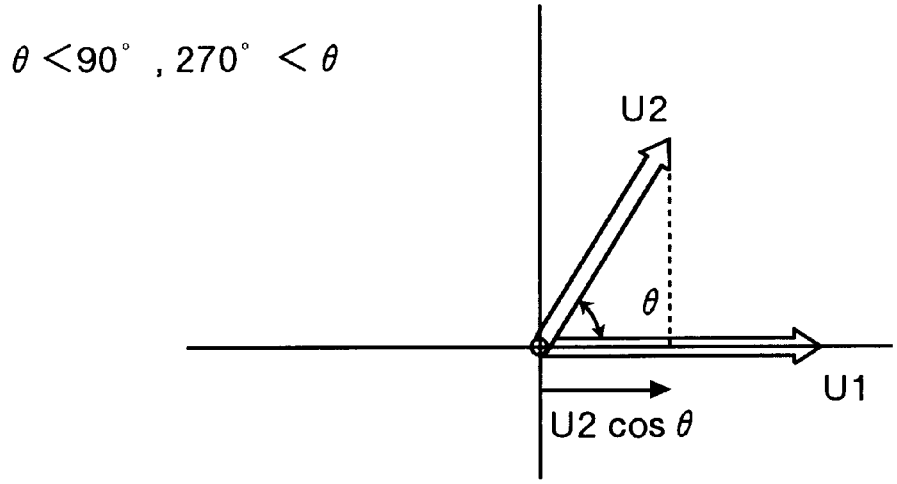
FIGS. 9A and 9B are explanatory views for explaining synthesized unbalance.
Figure 9B:
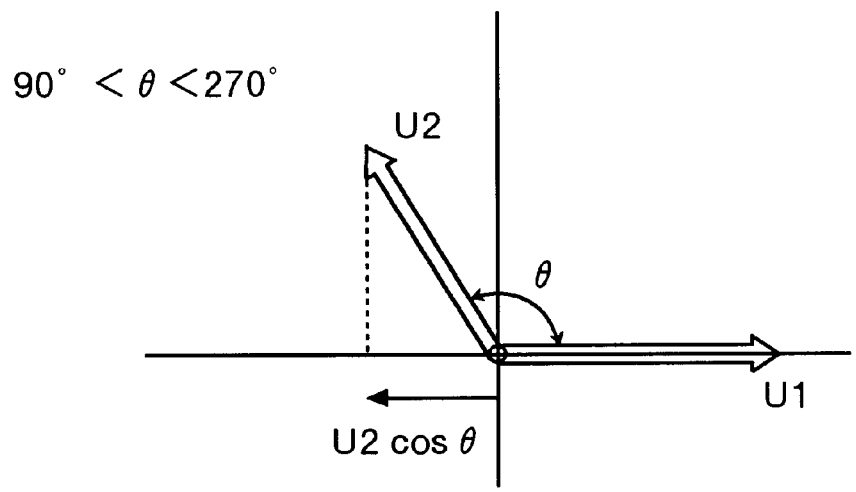

For example, when the displacement error signal is fluctuated in the stabilized area (indicated by the broken line) as shown in FIG. 6C, the operation of the galvanometer scanner is once stopped, deflection of the mounting angular position of the mirror is slightly changed, and the scanner is driven again. By repeating this operation several times, unbalance due to offset between the shaft 34 and the deflecting mirror 14 is finally suppressed, so that any mounting angular position where the operation of a galvanometer scanner is stabilized without generation of vibrations can be found.

After the deflecting mirror 14 is fixed to the shaft 34 by adjusting the mirror to the most appropriate mounting angular position found as described above, by rotating the rotational cylinder 30 integrally fixed to the galvanometer scanner 18, it is possible to position a laser beam at a center of a scanned area 48 when a positional instruction to the galvanometer scanner 18 is zero, namely even when the shaft 34 is positioned at the midpoint of the maximum rotational angle.

Namely, with the mounting/holding mechanism 20 according to the present invention, even if the deflecting mirror 14 is fixed to the shaft 34 of the galvanometer scanner 18 at any mounting angular position, adjustment of offset of a laser beam becomes possible by rotating the main body of the galvanometer scanner. As a result, vibrations generated by the mounting angular position of a deflecting mirror can be suppressed, so that the process of boring a printed circuit board can be performed with high speed and high accuracy. It should be noted that the same effect can be obtained for the galvanometer scanner 22 and the mounting/holding mechanism 24.

Figure 3B:
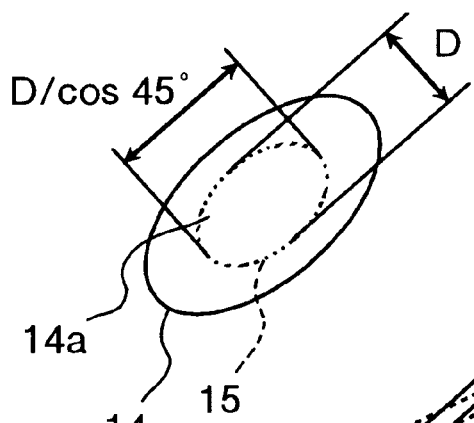
FIGS. 3A and 3B are explanatory views showing the deflecting mirror shown in FIG. 1.
Figure 3A:
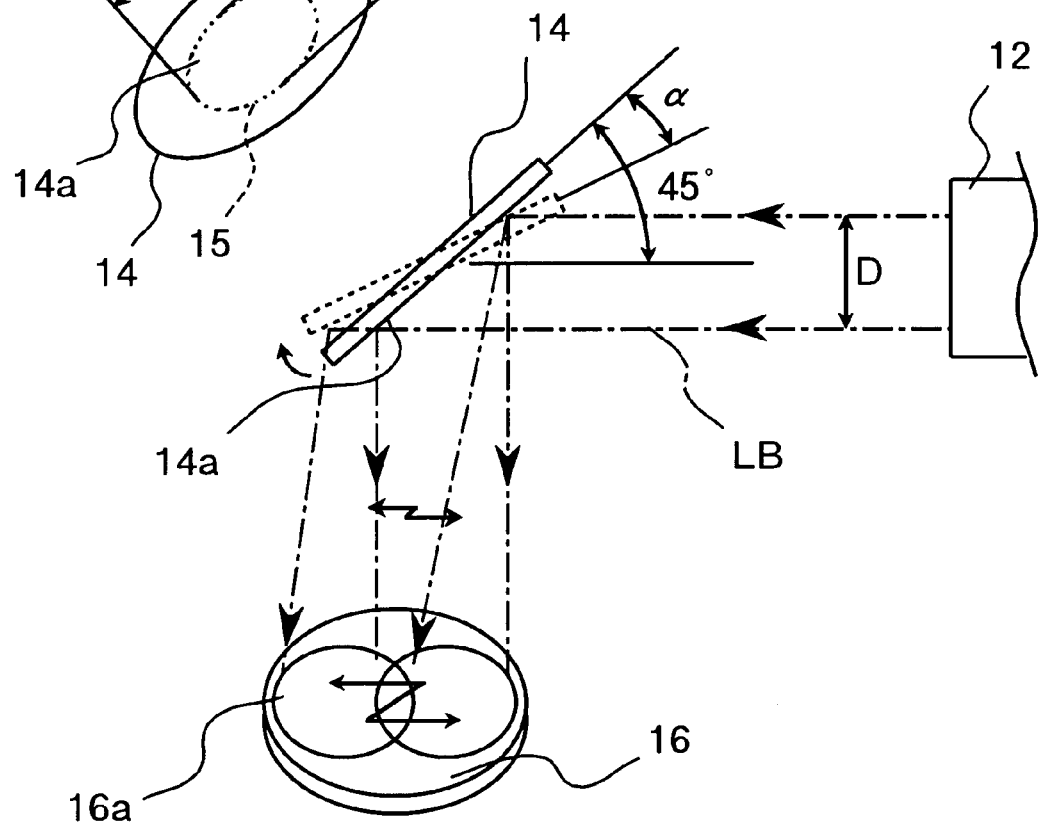
Figure 4:
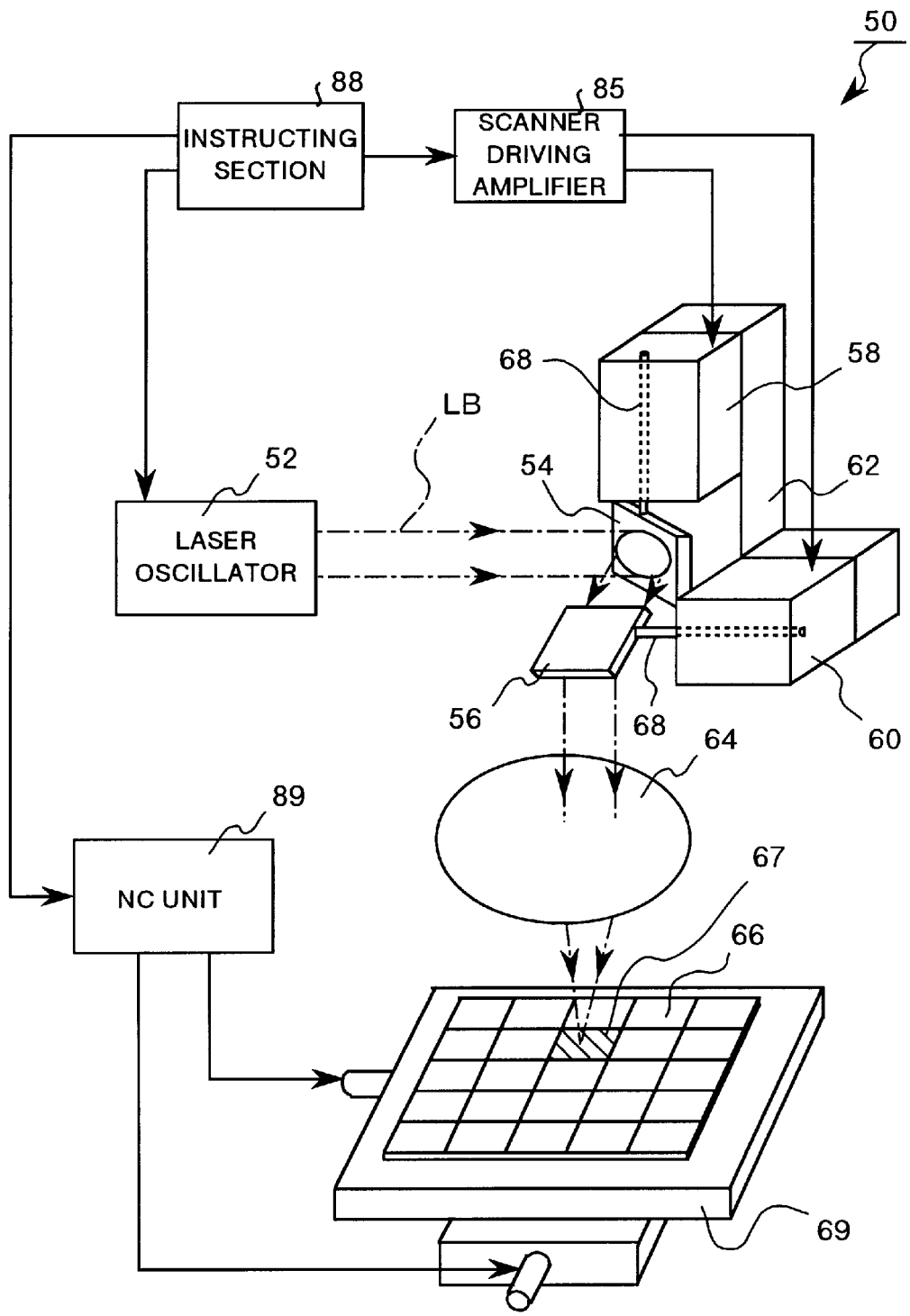
FIG. 4 is a perspective view showing schematic configuration of a laser machining apparatus based on the conventional technology.
Figure 5:
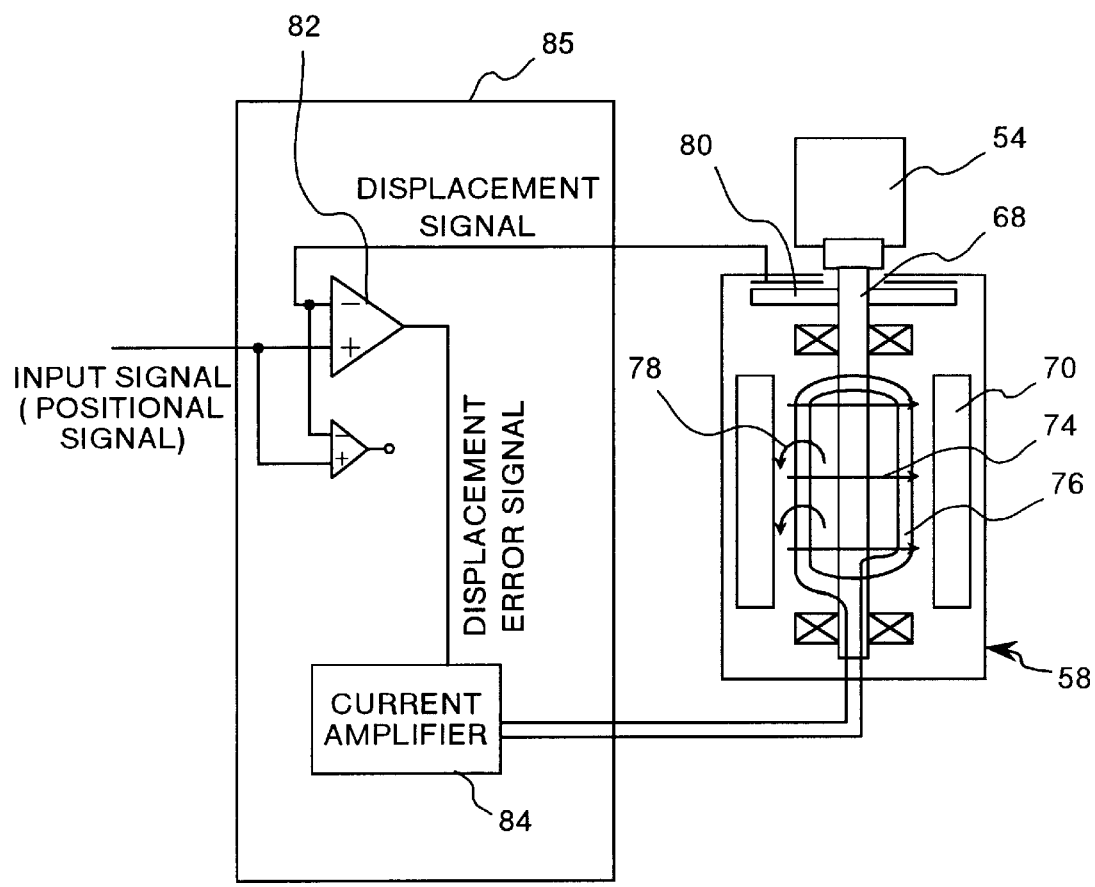
FIG. 5 is an explanatory view showing configuration of the galvanometer scanner shown in FIG. 4 as well as a peripheral circuit of the scanner.

FIGS. 3A and 3B show views for explaining the deflecting mirrors 14, 16 in FIG. 1, in which FIG. 3A is a perspective view to the deflecting mirrors 14, 16, and FIG. 3B is a view showing the deflecting mirror 14 from the viewpoint of a light receiving surface thereof. The deflecting mirrors 14, 16 according to the embodiment are characterized in that each of the mirrors has an oval shape or an elliptical shape as described later.

Assuming a laser beam LB with a circular cross section and a diameter D emitted from the laser oscillator 12, when the laser beam hits a light receiving surface 14a of the deflecting mirror 14 at an incident angle of 45°, an area 15 to which the laser beam is irradiated indicated by the broken line on the light receiving surface 14a of the mirror shown in FIG. 3B is an oval having a major axis of D/cos 45° and a minor axis of D.

Also, as shown in FIG. 3A, an area 15 to which the laser beam is irradiated indicated by the broken line on the light receiving surface 14a of the mirror when a deflecting angle is $\alpha$ is an oval having the major axis of D/cos (45°−$\alpha$) and the minor axis of D. As described above, when the light receiving surface 14a of the deflecting mirror 14 is set at least to be an oval covering the oval in the area 15 to which the laser beam is irradiated, all the incident laser beam can be reflected thereon.

Next consideration is made specifically on an advantage which may be obtained by setting a shape of the deflecting mirror 14 to an oval as shown in FIGS. 3A and 3B. In this embodiment, assuming that a laser beam LB is circle in form having a diameter of 30 mm (D=30 mm), an area to which the laser beam is irradiated when entering onto the light receiving surface 14a of the deflecting mirror 14 at an incident angle of 45° is an oval having the major axis of (30×√2) mm and the minor axis of 30 mm.

Also, assuming that the deflecting mirror based on the conventional technology as an object for comparison has a rotational axis in a direction of the minor axis of the oval shown in FIG. 3B to a rotating axis and a shape thereof is a rectangular one shape with the major edge of (30×√2) mm and the minor edge of 30 mm circumscribing the oval, and that this moment of inertia is 1, a moment of inertia of the oval according to the embodiment is 0.59.

The difference between the moments of inertia is derived from the fact that the moment of inertia is proportional to the square of the radius of a distance up to mass around the rotational center, and for this reason the shape is decided as an oval having less mass at a peripheral section away from the center of rotation, which is extremely helpful and effective in reduction of the moment of inertia as compared to that of the rectangle. As a result, by changing the shape of a deflecting mirror from a rectangle to an oval, the moment of inertia can be reduced as far as by around 40%, and for this reason, the process of boring a printed circuit board can be performed with further higher speed.

When a deflecting mirror is formed as an oval one with the same moment of inertia as that of the rectangle used as the example of an object for comparison described above, an area capable of receiving a laser beam can be made further larger, and in association with it, a diameter D of a beam form which can be reflect can be made larger. Here, as a spot size for converging a laser beam is inversely proportional to D, by forming the deflecting mirror as an oval one, a spot size finer as compared to that in a case of a rectangle can be obtained, and for this reason there is provided the advantage that it becomes possible to provide finer holes on a printed circuit board.

By forming the deflecting mirror 16 as an oval or elliptical one as shown in FIG. 3A considering the movement of a laser beam on a light receiving surface 16a of the deflecting mirror 16 due to swinging of a deflecting angle α of the deflecting mirror 14 similarly to the above example, all the received laser beam can be reflected thereon. In the case of this deflecting mirror 16, as shown in the example of comparison, there is also such an advantage that the moment of inertia can largely be reduced as compared to that when the mirror is formed as a rectangle one.

Further, a silicone crystal is employed as a substrate material for a deflecting mirror in this embodiment. In contrast, fused quartz crystal has been used as a substrate material of the deflecting mirror used in the laser machining apparatus for a process of boring a printed circuit board based on the conventional technology. A table below shows a relation between Young's modulus and a specific gravity of this fused quartz crystal (example of comparison) as well as of the silicone crystal (Embodiment).

| Material | Young's modulus (Nm$^{-2}$) | Specific gravity (g/cm$^3$) | Young' modulus/ Specific gravity |
| --- | --- | --- | --- |
| Fused quartz crystal | 7.31 × 10$^{10}$ | 2.20 | 3.32 |
| Silicon crystal | 13.0 × 10$^{10}$ | 2.33 | 5.58 |

As shown in this table, as for a silicone crystal, although the specific gravity is larger as compared to that of the fused quartz crystal, Young's modulus thereof is also larger, so that, if a value of Young's modulus/Specific gravity as one of indicators indicating solidity corresponding to hardness in deformation of a substrate is compared to that of the fused quartz crystal, it is understood that the value of silicone crystal is 1.7 times as higher as that of fused one. This higher value indicates that, if deflecting mirrors each having the same form and same thickness are made by using each of the substrate materials, the mirror made of silicone crystal can be harder in deformation than that made of fused quartz crystal.

The mirror used in a laser machining apparatus is subjected to flattening generally by polishing, and the mirror substrate may be deformed due to pressure applied thereto during polishing, and for this reason it is difficult to obtain high accuracy on a surface for maintaining performance of a laser beam if a substrate material is easily deformed. For example, it has been derived from practical experience that a substrate thickness of 3 mm or more is required for a substrate made of fused quartz crystal to obtain a mirror substrate with high accuracy having a size being capable of receiving a laser beam with a diameter of 30 mm.

Used for a substrate material of a deflecting mirror applied in this embodiment, as described above, is a silicone crystal being harder in deformation than that of the fused quartz crystal conventionally used, so that the thickness of the mirror substrate can be thinner under the condition of insuring the same flatness, and for this reason the moment of inertia of the deflecting mirror can be reduced. The inventor prototyped deflecting mirrors, for obtaining an optimal thickness of a substrate, by using mirror substrates comprising substrates made of silicone crystal having several types of thickness, and executed trials to find out a feasible thickness of the mirror substrate which had flatness for suppressing a moment of inertia to a low level.

As a result, it was found that high-accuracy flatness could comparatively easily be insured if the thickness of the substrate was 2 mm or more in the mirror substrate made of silicone crystal having a size capable of receiving a laser beam with a diameter of 30 mm, and if the thickness of the substrate was 3 mm or less, the moment of inertia could also be suppressed to a minimum level and a deflecting mirror could be swung rapidly enough.

Namely, by using a silicone substrate as a substrate material of a mirror and setting the thickness of the substrate to a range from 2 mm or more to 3 mm or less, a desirable result was obtained that a deflecting mirror with a low moment of inertia could be obtained without degradation of the flatness on the reflecting surface as compared to a case where a mirror substrate was formed by using a fused quartz crystal substrate as an example of comparison.

There is also merit in the high-solidity silicon crystal substrate that deformation is hard to occur due to force generated by high-speed vibrations of the mirror than that of the fused quartz crystal substrate.

As described above, with this embodiment, there is provided a mounting/holding mechanism for holding a galvanometer scanner for swinging a deflecting mirror through a shaft thereof so as to have rotational flexibility to the shaft, so that reduction of operational performance of the galvanometer scanner generated by a mounting angular position of the deflecting mirror can be suppressed, and for this reason the process of boring a printed circuit board can be performed with high speed and high accuracy.

Also, with this embodiment, by forming a deflecting mirror for reflecting a laser beam while swinging as an oval or elliptical one according to a beam form of a received laser beam, the deflecting mirror has resultantly a low moment of inertia, and for this reason the process of boring a printed circuit board can be performed with high speed and high accuracy.

Further, with this embodiment, a silicon crystal is used as a substrate material of a deflecting mirror, so that higher flatness can be obtained as compared to that of a case where the fused quartz crystal is conventionally used, and the substrate can be made thinner because of its high solidity, which makes it possible to reduce a moment of inertia.

Also, with this embodiment, the thickness of the substrate for a deflecting mirror is set in a range from 2 mm or more to 3 mm or less when a silicon crystal is used as a substrate material of the deflection mirror, so that sufficient flatness and a low moment of inertia can be acquired at the same time.

As described above, with the invention, there is provided a mounting mechanism for a galvanometer scanner capable of adjusting a mounting angular position of the galvanometer scanner around a shaft of a deflecting mirror, so that reduction of operational performance of the galvanometer scanner generated by a mounting angular position of the deflecting mirror can be suppressed, and the process of boring a printed circuit board can be performed with high speed and high accuracy.

With the invention, a deflecting mirror has a light-receiving area limited to an area which the laser beam moving in association with deflection of the mirror actually enters, so that the deflecting mirror requires only a minimum size with a required form, and a moment of inertia becomes smaller, and for this reason the process of boring a printed circuit board can be performed with high speed and high accuracy.

With the invention, by using a silicon crystal as a substrate material of a deflecting mirror, the solidity is made higher and the mirror is hard to be deformed, so that higher flatness can be obtained.

With the invention, by setting a thickness of a substrate for a deflecting mirror using a silicon crystal in a range from 2 mm or more to 3 mm or less, insuring higher flatness, and forming the substrate as thinner as possible, a deflecting mirror with a low moment of inertia can be obtained without degradation of flatness on a reflecting surface.

This application is based on Japanese patent application No. HEI 10-047167 filed in the Japanese Patent Office on Feb. 27, 1998, the entire contents of which are hereby incorporated by reference.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A laser machining apparatus comprising:
    a laser oscillator for emitting a laser beam;
    a deflecting mirror for reflecting a laser beam from said laser oscillator;
    a galvanometer scanner for swinging said deflecting mirror; and
    a mounting mechanism for said galvanometer scanner adapted for adjusting a mounting angular position of said galvanometer scanner around a central axis of a shaft of said deflecting mirror.

2. A laser machining apparatus according to claim 1; wherein said deflecting mirror comprises a substrate made of a silicon crystal.

3. A laser machining apparatus according to claim 2; wherein said substrate of the mirror has a thickness in a range from 2 mm or more to 3 mm or less.

4. A laser machining apparatus as claimed in claim 1, wherein
    said shape of said deflecting mirror is oval or elliptical, and a size of said deflecting mirror is such that, for a given diameter of said laser beam, a moment of inertia of said deflecting mirror is minimized.

5. The laser machining apparatus according to claim 1, wherein said deflecting mirror is connected to said galvanometer by said shaft, and wherein a mounted angle of said deflecting mirror with respect to said shaft is adjustable.

6. The laser machining apparatus according to claim 5, wherein said deflecting mirror is mounted to said shaft at an angular position with respect to said shaft so as to minimize vibrations of said deflecting mirror during operation of said laser machining apparatus.

7. A laser machining apparatus as claimed in claim 1, wherein
    said mounting mechanism has a rotational cylinder to which said galvanometer scanner is fixed, such that a central axis of said rotational cylinder is identical to the central axis of said shaft of said deflecting mirror.

8. A laser machining apparatus as claimed in claim 7, wherein
    said rotational cylinder is contained within a rotational cylinder-receiver, so that said rotational cylinder can be rotated from one fixed position to another, thereby allowing adjustment of said mounting angular position around the central axis of said shaft of said deflecting mirror.

9. A laser machining apparatus comprising:
    a laser oscillator for emitting a laser beam;
    deflecting mirrors for reflecting a laser beam from said laser oscillator; and
    a galvanometer scanner for swinging said deflecting mirrors; wherein
    a first deflecting mirror has a size and shape such that it reflects all of a laser beam, which is moving in association with deflection of the first deflecting mirror, only to a light receiving area on a second deflecting mirror; and
    wherein said shape of said first deflecting mirror is oval or elliptical, and said size of said first deflecting mirror is such that, for a given diameter of said laser beam a moment of inertia of said first deflecting mirror is minimized.

10. A laser machining apparatus according to claim 9; wherein said first deflecting mirror comprises a substrate made of a silicon crystal.

11. A laser machining apparatus according to claim 10; wherein said substrate of the first deflecting mirror has a thickness in a range from 2 mm or more to 3 mm or less.

12. The laser machining apparatus according to claim 9, wherein a footprint of the laser beam on said deflecting mirror has a maximum dimension along a line parallel to a major axis of said deflecting mirror at a maximum swing of said deflecting mirror.

13. A laser machining apparatus, comprising:
    a laser oscillator for emitting a laser beam;
    a deflecting mirror for reflecting a laser beam from said laser oscillator; and
    a galvanometer scanner for swinging said deflecting mirror; wherein
    said deflecting mirror is connected to said galvanometer scanner by a shaft rotatable about a central axis of said shaft, and wherein
    said deflecting mirror has a maximum length in a direction parallel to said shaft axis which is greater than a maximum length of said deflecting mirror in a direction perpendicular to said shaft axis.

14. The laser machining apparatus according to claim 13, wherein said deflecting mirror has an oval shape.

15. The laser machining apparatus according to claim 14, wherein said maximum length corresponds to a major axis of said deflecting mirror, and wherein a footprint of the laser beam on said deflecting mirror has a maximum dimension along a line parallel to the major axis of said deflecting mirror at a maximum swing of said deflecting mirror.

16. The laser machining apparatus according to claim 13, wherein said deflecting mirror is attached to said shaft so as to be symmetric about the shaft central axis.

17. A laser machining apparatus comprising:

a laser oscillator for emitting a laser beam;

deflecting mirrors for reflecting a laser beam from said laser oscillator; and a galvanometer scanner for swinging said deflecting mirrors; wherein a first deflecting mirror has a size and shape such that it reflects all of a laser beam, which is moving in association with deflection of the first deflecting mirror, only to a light receiving area on a second deflecting mirror; and wherein said first deflecting mirror comprises a substrate made of a silicon crystal.

18. A laser machining apparatus according to claim 17; wherein said substrate of the first deflecting mirror has a thickness in a range from 2 mm or more to 3 mm or less.

* * * * *